(12) United States Patent
Kearney et al.

(10) Patent No.: US 6,554,968 B1
(45) Date of Patent: Apr. 29, 2003

(54) METHOD FOR MEASURING AND CONTROLLING BEAM CURRENT IN ION BEAM PROCESSING

(75) Inventors: Patrick A. Kearney, Livermore, CA (US); Scott C. Burkhart, Livermore, CA (US)

(73) Assignee: The Regents of the University of California, Oakland, CA (US)

( * ) Notice: Subject to any disclaimer, the term of this patent is extended or adjusted under 35 U.S.C. 154(b) by 98 days.

(21) Appl. No.: 09/670,921

(22) Filed: Sep. 29, 2000

(51) Int. Cl.[7] ............................................. C23C 14/34
(52) U.S. Cl. .................... 204/192.11; 204/298.04; 315/111.21; 315/111.31; 315/111.61; 315/111.91; 250/423 R; 250/424; 250/492.21; 250/492.3
(58) Field of Search .................. 315/111.21, 111.31, 315/111.61, 111.91; 250/423 R, 424, 492.21, 492.3; 204/192.11, 298.04

(56) References Cited

U.S. PATENT DOCUMENTS 5,969,470 A * 10/1999 Druz et al. ............... 313/359.1
6,225,747 B1 * 5/2001 Fremgen, Jr. et al. .. 315/111.91

* cited by examiner

Primary Examiner—Rodney G. McDonald
(74) Attorney, Agent, or Firm—L. E. Carnahan; Alan H. Thompson

(57) ABSTRACT

A method for producing film thickness control of ion beam sputter deposition films. Great improvements in film thickness control is accomplished by keeping the total current supplied to both the beam and suppressor grids of a radio frequency (RF) in beam source constant, rather than just the current supplied to the beam grid. By controlling both currents, using this method, deposition rates are more stable, and this allows the deposition of layers with extremely well controlled thicknesses to about 0.1%. The method is carried out by calculating deposition rates based on the total of the suppressor and beam currents and maintaining the total current constant by adjusting RF power which gives more consistent values.

8 Claims, 2 Drawing Sheets

METHOD FOR MEASURING AND CONTROLLING BEAM CURRENT IN ION BEAM PROCESSING

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to ion beam sputter deposition of multilayer films, particularly to controlling the thickness of the individual layers of the multilayer films, and more particularly to a method for controlling film thickness by keeping the total current supplied to both the beam and suppressor grids of an RF ion beam source constant by adjusting the plasma density (RF power).

Ion beam sputter deposition is used for a variety of applications, particularly in the semiconductor, magnetics and optical industries. Film thickness control is critical for many of these applications, such as the fabrication of masks for extreme ultraviolet (EUV) lithography. In the past, a great amount of effort has been directed to maintaining wavelength control in ion beam sputter deposition, particularly in blanks deposited in a mask blank tool. Typically, the film thickness has been controlled by supplying a constant beam current for a constant time. The current supplied to the beam grid is kept constant by changing the plasma density. Grid interception of the ion beam can change with time and makes regulating deposition rate in this manner unstable. Thus, there has been a need for controlling beam current whereby the current of the ion beam is maintained constant and thus the thickness of the films being deposited is maintained constant, and therefore the blank wavelength is constant.

The present invention provides a solution to this need by providing a method involving the measurement of the current to the suppressor and beam grids, and controlling the total current applied to both grids constant. Thus, using the method of this invention, the deposition rate of a three grid, RF ion beam source is controlled by keeping the total current supplied to the beam (inner) and suppressor (middle) grids constant by adjusting the plasma density (RF power).

SUMMARY OF THE INVENTION

It is an object of the present invention to provide for controlled thickness of a film deposited by ion beam sputtering.

A further object of the invention is to provide a method for measuring and controlling beam current in ion beam processing.

Another object of the invention is to provide film thickness control during ion beam sputter deposition by keeping constant the total current supplied to the beam and suppressor grids of an ion beam source.

Another object of the invention is to provide a method for controlling the deposition rate of an RF ion beam source by providing a constant current to both the beam grid and the suppressor grid by adjusting the plasma density of the source.

Other objects and advantages of the present invention will become apparent from the following description and accompanying drawings. The invention involves controlling film thickness by measuring and controlling the current to both the beam grid and the suppressor grid of an ion beam source. Since grid interception of an ion beam can change with time and thus change the rate of deposition, thereby varying the thickness of a film being deposited, by measuring the current of at least the suppressor grid as well as the beam grid, and maintaining the current of both grids constant, deposition rate and thus film thickness can be effectively controlled. The method of this invention, which involves calculating deposition rates based on the total of the suppressor and beam grid currents enables the control of deposited film thickness to about 0.1%. Such film control thickness is particularly critical for applications in the field of multilayer optics, semiconductors, and magnetics, since the method of this invention enables long term deposition stability.

BRIEF DESCRIPTION OF THE DRAWINGS

The accompanying drawings, which are incorporated into and form a part of the disclosure, illustrate an embodiment of the invention and, together with the description, serve to explain the principles of the invention.

DETAILED DESCRIPTION OF THE INVENTION

The present invention is directed to controlling the deposition rate, and thus the thickness of a film being deposited, using a three grid radio frequency (RF) ion beam source, by keeping the total current supplied to the beam (inner) grid and the suppressor (middle) grid constant by adjusting the plasma density (RF power). The method of this invention involves calculating deposition rates based on the total of the suppressor and beam grid currents and keeping the total current supplied to both grids constant, which enables control of the deposited thickness to about 0.1%. The method of this invention differs from prior approaches in that it controls both the suppressor and the beam grid currents, rather than only the current supplied to the beam grid. Thus, this invention enables the use of ion beam sputter deposition for producing films, including multilayer films where film thickness control is critical, as for masks in EUV lithography systems, wherein maintaining wavelength control in blanks deposited in the mask blank tool. This method for measuring beam current allows tighter control of mask blank wavelength.

In the method of the present invention the wavelength, thickness, and the ALS are all related. Deposition rate is proportional to beam current ($i_b$). Film thickness is the product of deposition rate and deposition time. We measure the thickness of our blanks by reflecting EUV light off them and determining which wavelength they reflect (the wavelength is proportional to the thickness). The ALS is used because it measures directly the important properties of the blank and is very precise.

Figure 1:
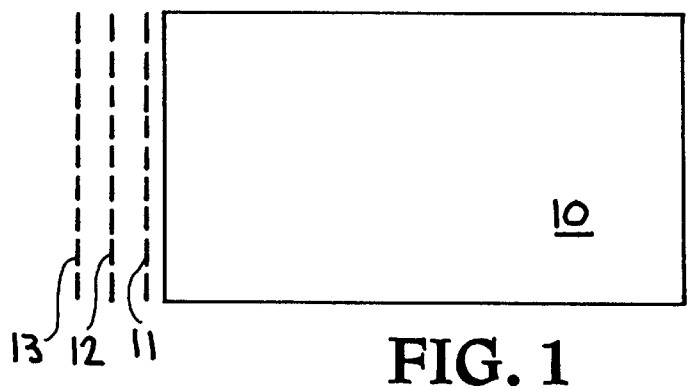
FIG. 1 schematically illustrates a three grid RF ion beam source by which the grid currents are controlled by the method of this invention.

The present invention is described thereinafter in two sections, theory and experimental evidence, as applied to a three (3) grid RF ion beam source, such as manufactured by VEECO industries. As shown in FIG. 1, the ion source or gun 10 includes an inner or beam grid 11, a middle or suppressor grid 12, and an exit or ground grid 13.

Figure 2:
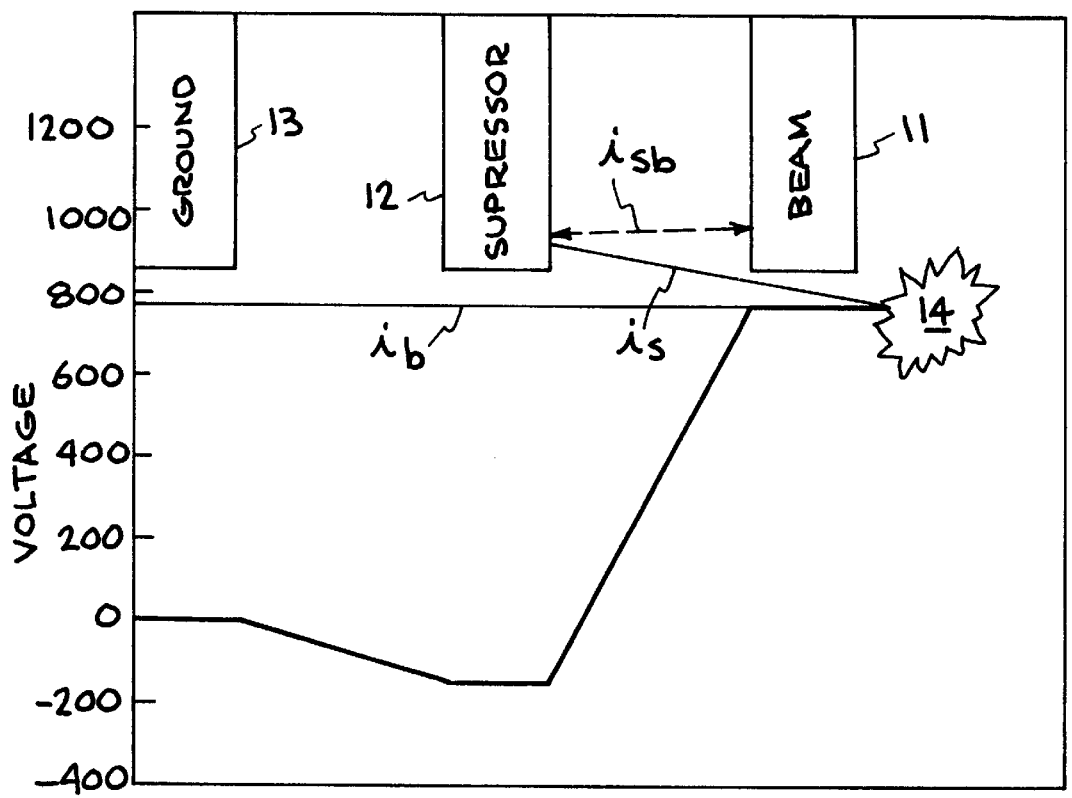
FIG. 2 illustrates the variation of potentials near the ion gun grids of FIG. 1, with elections being driven away from the suppressor grid, while ions are attracted thereto.

Theory:

FIG. 2 shows how the voltages change between the grids of the ion gun. The plasma, shown at the right of FIG. 2, and indicated at 14, which may be composed of Ar+ ions, is floating near the beam grid potential (typically 780V). Ions that approach the beam grid 11 are accelerated to the left by the potentials. Most of these ions are ejected from the gun via the "hole" in the exit or ground grid 13, but significant fractions intercept the suppressor and ground grids. The question is how does the interception of these ions by these grids influence control over the ion beam current at the target?

The answer to this question is based on approximations, described hereinafter. The first, is to ignore the ground grid 13, for two reasons: 1) the way the ion source or gun is currently tuned, the ground current is much less than the suppressor current, and 2) the ground grid 13 sees current from the target, not shown, and that produces a complication beyond the scope of the present invention, of which experimentation has not yet been undertaken. The ground current may be important, but the present invention only involves the effect of the fractions of ions that intercept the suppressor grid 12, as shown in FIG. 2.

An ion hitting the suppressor grid 12 will, in addition to carrying charge to the grid, possibly eject both positive and negative charges from the grid (electrons and ions). Because the suppressor grid is at a negative potential with respect to its surroundings, positive charges will end up on the suppressor grid for no net current flow. The negative charges on the other hand will be attracted away from the suppressor grid and be collected by the beam grid 11 and ground grid 13.

The second approximation: all electrons ejected by the suppressor grid 12 end up going to the beam grid 11. The justification is as follows: most of the election generation will be on the beam grid side of the suppressor grid since the ions are traveling in a direction from the beam to the suppressor grids, as seen in FIG. 2. It is true some electrons will be ejected "in the hole" in the suppressor grid, but even those will be more strongly attached to the beam grid.

Now, one does a current balance relating the values one measures to those one really wants to control. A convention is useful. Let a capital I refer to currents that are measured on the power supplies, lower case i refer to a physical current in the gun, for example $i_b$ is the beam current (ion current ejected from the gun towards the target), while $I_b$ is the beam voltage power supply current reading (current required to keep the beam voltage at its setpoint.

In FIG. 2, three (3) physical currents have been defined: current $i_b$ (the ion current ejected from the gun), current $I_{sb}$ (the electron current from the suppressor grid 12 to the beam grid 11), and current $i_s$ (the ion current intercepted by the suppressor grid 12). As pointed out above, the ion cur rent intercepted by the ground grid 13 is being ignored. $I_b$ is the current required to keep the beam voltage at its setpoint, it has to supply both $i_b$ and $i_s$ as well sink $i_{sb}$. $I_s$ is the current required to keep the suppressor grid at its setpoint, it must supply electrons to make up $i_{sb}$ and neutralize $i_s$. Note, $I_s$ is positive here and it is measured in the system of FIG. 2, but it actually corresponds to net electron flow to the suppressor grind.

The following equations illustrate to system implementation:

$$I_b = i_b + i_s + i_{sb}$$

$$I_s = i_s + i_{sb}$$

$$\therefore i_b = I_b - I_s$$

Since deposition rate depends on the number of ions that actually hit the target, one should be controlling and calculating the deposition rate based on $i_b$, not $I_b$, as is currently done. Fortunately, $i_s$ is readily calculable from existing current measurements.

Experimental Evidence:

Table 1 shows the data that motivated the method of the present invention. Routine wavelength measurements made on about every 5$^{th}$ multilayer grown over a 51 multilayer (3 pod) span showed a disturbing trend. To extreme ultraviolet centroid wavelength was measured at the Advance Light Source Bearnline 6.3.2. The measured Advanced Light Source (ALS) wavelength shifted from ~131.7 to 130.3 and back again, even though the measured beam current ($I_b$) appeared stable (299.30–299.49, or 0.066% p-v). Closer examination of the data log showed that the wavelength data appeared correlated with the measured suppressor current ($I_s$).

TABLE 1

| Sample | Ib (mA) | Is(mA) | Ib(mA) | ALS Waveleng (Angstrom) |
|---|---|---|---|---|
| 144-02 | 299.49 | 16.63 | 282.86 | 131.438 |
| 144-08 | 299.40 | 15.66 | 283.74 | 131.768 |
| 144-14 | 299.37 | 18.32 | 281.05 | 130.284 |
| 144-20 | 299.30 | 17.92 | 281.38 | 130.432 |
| 144-22 | 299.31 | 18.75 | 280.56 | 130.360 |
| 148-02 | 299.43 | 18.21 | 281.22 | 130.340 |
| 148-08 | 299.40 | 18.54 | 280.86 | 130.191 |
| 148-15 | 299.34 | 17.95 | 281.40 | 130.265 |
| 148-19 | 299.34 | 15.64 | 283.70 | 131.402 |
| 149-02 | 299.37 | 14.80 | 284.57 | 131.917 |
| 149-08 | 299.37 | 15.43 | 283.94 | 131.614 |
| 149-20 | 299.37 | 14.96 | 284.41 | 131.619 |
| 149-24 | 299.36 | 15.32 | 284.04 | 131.424 |

Figure 3:
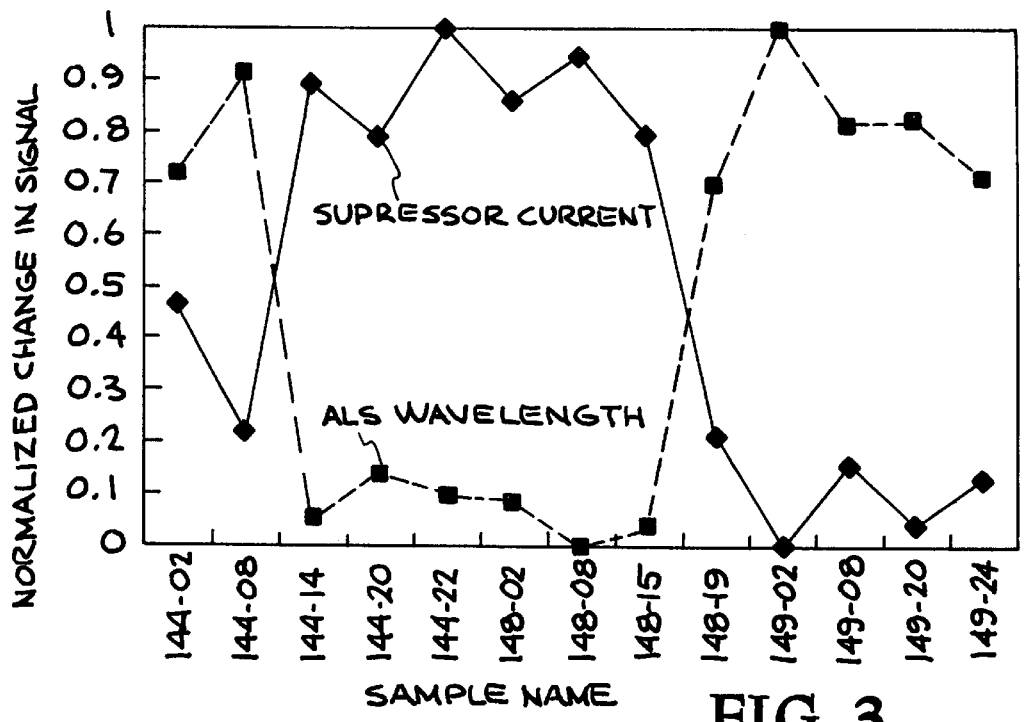
FIG. 3 graphically illustrates the correlation between suppressor grid current and ALS wavelength (which is proportional to thickness), with constant current ($I_b$) and deposition time.

FIG. 3 shows the variation in suppressor grid current and ALS wavelength for the samples in Table 1. In FIG. 3, both signals have been normalized so that their peaks to valley variation is plotted as a variation between 0 and 1. It is clear from FIG. 3 that the two signals are correlated (over this limited data set).

Figure 4:
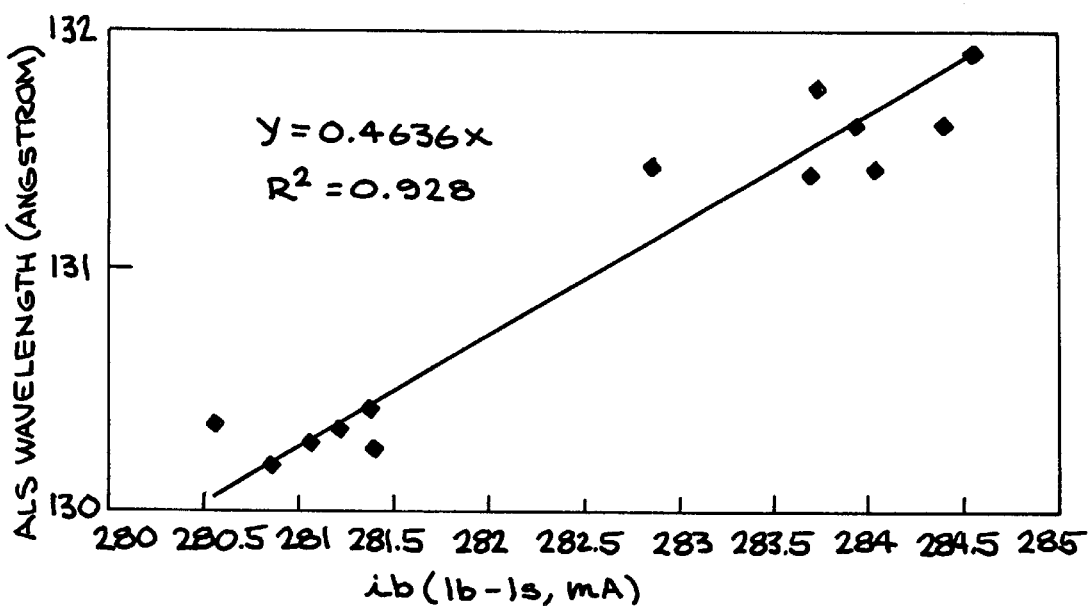
FIG. 4, graphically illustrates wavelength vs. current ($I_b$) for constant deposition time.

FIG. 4 shows how ALS wavelength varies with calculated $i_b$ (not $I_b$) for the samples in Table 1. The theory presented above would predict that ALS wavelength would be proportional to $i_b$. Thus, the data of Table 1 verifies the theory. The quality of the fit indicates that a large portion of the variation in wavelength can be attributed to variations in $I_b$. The obvious solution is to regulate on $i_b = I_b - I_s$ instead of $I_b$. From these samples (Table 1) one can estimate how much this regulation scheme would improve the wavelength stability by looking at the magnitude of the deviations from the line in FIG. 4. In the original data, the peak to valley wavelength deviation was 1.76 angstroms, by removing effects due to $I_s$ variation one could in theory reduce these variations to 0.56 angstrom peak to valley. In terms of a wavelength standard deviation, a reduction from 0.68 to 0.18 angstrom might be expected.

Looking at the data of Table 1 more closely, the next channel that correlates with the residual wavelength errors is chamber pressure. Perfect pressure control would theoretically reduce the residual standard deviation from 0.18 to 0.096 angstrom. Sensitivity of deposition rate to pressure deviations has been previously determined.

Also, it should be noted that the values of $I_b$ and $I_s$ of Table 1 are averages based on the average currents for each layer in the stack. The ALS wavelength also averages the layer thicknesses, but it heavily weights to top few layers in the average. Therefore, having closed loop control of $i_b$ might actually do a better job of controlling the ALS wavelength that set forth above. (The data set forth above was effectively adjusted for the average suppressor grid current in the multilayer, but it varies throughout the multilayer, thus faster correction would be better.)

There are $I_s$ changes in the three grid ion beam source in which the data of Table 1 was generated due to thermal expansion. It is believed that the changes seen here in suppressor grid current are due to changes in grid spacing and/or alignment. Thus, grids being more symmetrically and firmly mounted, and having better hole alignment from the start than the presently used grids will undoubtedly resolve or reduce problems with thermal expansion that the current grids show.

Based on the data of Table 1, a change from controlling $I_b$ is controlling $i_b$, will provide a more stable deposition rate and thus greater thickness control of films being deposited by ion beam sputtering. Currently, $I_b$ is measured using a high quality current meter, but $I_s$ is measured using a 0–5V signal on the back of the power supply and an a-d card. One could quickly change the regulation scheme so as to keep $i_b$ constant, but upgrading the $I_s$ measurement to a high quality meter should also be done.

It is simple to subtract the two currents in software, but producing a working system requires special attention to how any changes will effect startup and regulation. At start up, the suppressor grid current changes quickly for a few minutes while the gun heats up. Trying to regulate too early in the process might result in an unstable system. During this warm-up period a fixed "average" suppressor grid current should be used instead of the actual measured value. After the Plasma Bridge Neutralizer (PBN) is off and the suppressor grid has stabilized, the one would go through the existing regulation routine with three changes. First, regulate on $i_b$ instead of $I_b$. Second, since the suppressor grid current is not measured with a high quality meter, one should carefully average that current so it doesn't respond to noise in the data. Third, one will need to put limits on how large an $I_s$ one wants to correct, it should be in a 0–25 mA range. By these changes in the ion beam source or gun, the deposition rate can be controlled by keeping the total current supplied to the beam grid and the suppressor grids constant by adjusting the plasma density (RF power).

It has thus been shown that by calculating deposition rates based on the total of the suppressor grid and beam grid currents gave much more consistent values, rather than by merely adjusting the RF power to keep the current supplied to the beam grid constant, as previously done. This total current control enables one to control the deposited thickness to about 0.1%. Thus, with the method of their invention, the ion beam sputter deposition can be utilized where thickness of the deposited films is critical, such as in the mask for the EUV lithography systems.

While particular parameters, operational steps, etc. have been described and/or illustrated to exemplify and explain the principles of this invention, such are not intended to be limiting. Modifications and changes may become apparent to those skilled in the art, and it is intended that the invention be limited only by the scope of the appended claims.

What is claimed is:

1. A method for controlling thickness of a film formed by ion beam sputter deposition, comprising:

supplying a constant sum of beam grid current and suppressor grid current, and wherein supplying the constant sum of beam grid and suppressor grid currents is carried out by adjusting the plasma density.

2. The method of claim 1, wherein by controlling the ion current ejected from an ion gun ($i_b$) instead of controlling the current required to keep the beam voltage at its setpoint ($I_b$).

3. The method of claim 2, wherein I(b) equals $I_b$ minus the current required to keep the suppressor grid at its setpoint ($I_s$).

4. The method of claim 2, wherein an ALS wavelength is proportional to $i_b$.

5. In a method for controlling the deposition rate of a film formed by an RF ion beam gun having a beam grid, a suppressor grid and a ground grid, the improvement comprising:

keeping the total current supplied to both the beam and suppressor grids constant by adjusting the RF power.

6. The improvement of claim 5, wherein keeping the current to both grids constant produces a deposition rate whereby the deposited film thickness is controlled to about 0.1%.

7. The improvement of claim 5, wherein adjusting the RF power is determined by measuring the current to both the beam grid and the suppressor grid, and then controlling the ion current ejected from the ion beam gun by adjusting the RF power such that the total current supplied to both the beam and suppressor grids is constant.

8. In an RF ion beam source having a beam grid, a suppressor grid, and a ground grid, the improvement comprising:

means for measuring the current supplied to the beam grid and the suppressor grid, and means for keeping the total current supplied to the beam and suppressor grids constant which includes means for adjusting RF power.

* * * * *